(12) United States Patent
Thompson

(10) Patent No.: US 10,763,389 B1
(45) Date of Patent: Sep. 1, 2020

(54) LED STRUCTURE WITH MINIMIZED LIGHT EMISSION AREA

(71) Applicant: Facebook Technologies, LLC, Menlo Park, CA (US)

(72) Inventor: Daniel Bryce Thompson, Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/437,567

(22) Filed: Jun. 11, 2019

(51) Int. Cl.
| | |
|---|---|
| *H01L 33/32* | (2010.01) |
| *H01L 33/20* | (2010.01) |
| *H01L 33/00* | (2010.01) |
| *H01L 33/40* | (2010.01) |
| H01L 33/06 | (2010.01) |

(52) U.S. Cl.
CPC .......... *H01L 33/0075* (2013.01); *H01L 33/32* (2013.01); *H01L 33/405* (2013.01); *H01L 33/06* (2013.01); *H01L 33/20* (2013.01); *H01L 2933/0016* (2013.01)

(58) Field of Classification Search
CPC ......... H01L 33/60; H01L 33/20; H01L 33/62; H01L 33/54; H01L 33/58; H01L 33/325; H01L 33/0075; H01L 2933/0075

USPC ............... 257/98, 99, 95; 438/22, 25, 26, 29
See application file for complete search history.

(56) References Cited

U.S. PATENT DOCUMENTS

2008/0217635 A1* 9/2008 Emerson et al. ..... H01L 33/145
257/98

* cited by examiner

*Primary Examiner* — Thinh T Nguyen
(74) *Attorney, Agent, or Firm* — Kilpatrick Townsend & Stockton LLP

(57) ABSTRACT

Described herein are light emitting apparatuses with minimized light emission areas and methods for fabricating such apparatuses. In certain embodiments, the emission area corresponds to an area of an electrical contact and is minimized by minimizing the area of the electrical contact. The electrical contact is configured to receive an electrical signal that causes a light emission layer to generate light. The light emission layer is between a first semiconductor layer and a second semiconductor layer, with the electrical contact being formed on the second semiconductor layer. To protect the second semiconductor layer from damage during an etching process, a conductive body is formed around the electrical contact, where the conductive body is a non-ohmic contact to the second semiconductor layer. The conductive body acts as an etch stop against unintended etching of the second semiconductor layer as a result of an alignment error during the etching process.

20 Claims, 8 Drawing Sheets

US 10,763,389 B1

LED STRUCTURE WITH MINIMIZED LIGHT EMISSION AREA

BACKGROUND

Light emitting diodes (LEDs) convert electrical energy into optical energy and offer many benefits over other light sources, such as reduced size, improved durability, and increased energy efficiency. LEDs can be used as light sources in many display systems, such as televisions, computer monitors, laptop computers, tablets, smartphones, and wearable electronic devices. Some LEDs are formed using III-V semiconductors, which are semiconductors comprising a compound composed of an element from Group III of the periodic table in combination with an element from Group V. III-V semiconductors offer several advantages over other semiconductor materials, including the ability to create a smaller size LED (e.g., a micro-LED with a diameter of less than 100 micrometers ($\mu m$)), higher packing density (and hence higher display resolution), and higher brightness. However, some III-V semiconductors are susceptible to damage, decreasing LED performance. For example, if a III-nitride (where the Group V element is nitrogen) is exposed to certain etching agents during the manufacturing process, the resulting LED may be less bright.

SUMMARY

This disclosure relates generally to LEDs having a minimized light emission area. In certain applications, such as LED based flashlights, it is desirable for the light produced by an LED to be widely spread. In other types of applications, such as displays for wearable electronic devices, it can be desirable to minimize the spread of light from an LED. In particular, it is sometimes desirable for an LED to operate as a point source of collimated light. To achieve a good point source, the emission area of the LED should be as small as possible. The smallest achievable size for any particular component of a semiconductor device, referred to herein as the minimum feature size, is often limited by the specific manufacturing equipment used. The minimum feature size could, for example, be on the order of three hundred nanometers (nm).

Semiconductor devices are usually created as a layered structure using multiple processing steps including, for example, deposition and etching. When manufacturing an LED having an emission area corresponding to the minimum feature size, additional precision is often required, especially during etching steps. For example, etching can be performed using photolithography in which a patterned mask is applied to cover areas that are not being etched. If the mask is not properly aligned with respect to the emission area, then areas beyond the emission area (e.g., an area comprising a III-nitride) could be inadvertently exposed to etching agents. Further, if the emission area is formed with the minimum feature size, alignment may be difficult given the level of precision needed for perfect alignment. Therefore, the design of the LED and the manufacturing process should take into consideration the possibility of alignment errors.

Techniques are described herein for creating an LED with a minimized light emission area while protecting areas around the emission area from damage during the manufacturing process. The techniques include, among other things, introducing an etch stopping layer formed of a suitable material that is appropriate in relation to the other materials in or around the emission area. In certain embodiments, the emission area corresponds to an area of an electrical contact, and the etch stopping layer is provided by a conductive body formed around the electrical contact. The example techniques can be applied for use with III-nitride based LEDs, but are also applicable to other types of materials. Other modifications to the LED structures or processing steps described herein will be apparent to one of ordinary skill in the art in view of the present disclosure.

According to certain embodiments, a light emitting apparatus includes a first semiconductor layer and a second semiconductor layer of opposite doping type, a light emission layer between the first semiconductor layer and the second semiconductor layer, and an electrical contact formed on the second semiconductor layer. The first semiconductor layer, the second semiconductor layer, and the light emission layer form a mesa. The electrical contact is an ohmic contact to the second semiconductor layer and is configured to receive an electrical signal that causes the light emission layer to generate light. The light emitting apparatus further includes a conductive body formed around the electrical contact. The conductive body is a non-ohmic contact to the second semiconductor layer.

According to certain embodiments, a method for manufacturing a light emitting apparatus includes forming a first semiconductor layer on a substrate, the first semiconductor layer having a doping type; forming a light emission layer on the first semiconductor layer; and forming a second semiconductor layer on the light emission layer such that the light emission layer is situated between the first semiconductor layer and the second semiconductor layer. The second semiconductor layer has a doping type opposite that of the first semiconductor layer. The method further includes forming an electrical contact on the second semiconductor layer; etching the first semiconductor layer, the second semiconductor layer, and the light emission layer to form a mesa; and forming a conductive body around the electrical contact. The electrical contact is an ohmic contact to the second semiconductor layer. The conductive body is a non-ohmic contact to the second semiconductor layer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
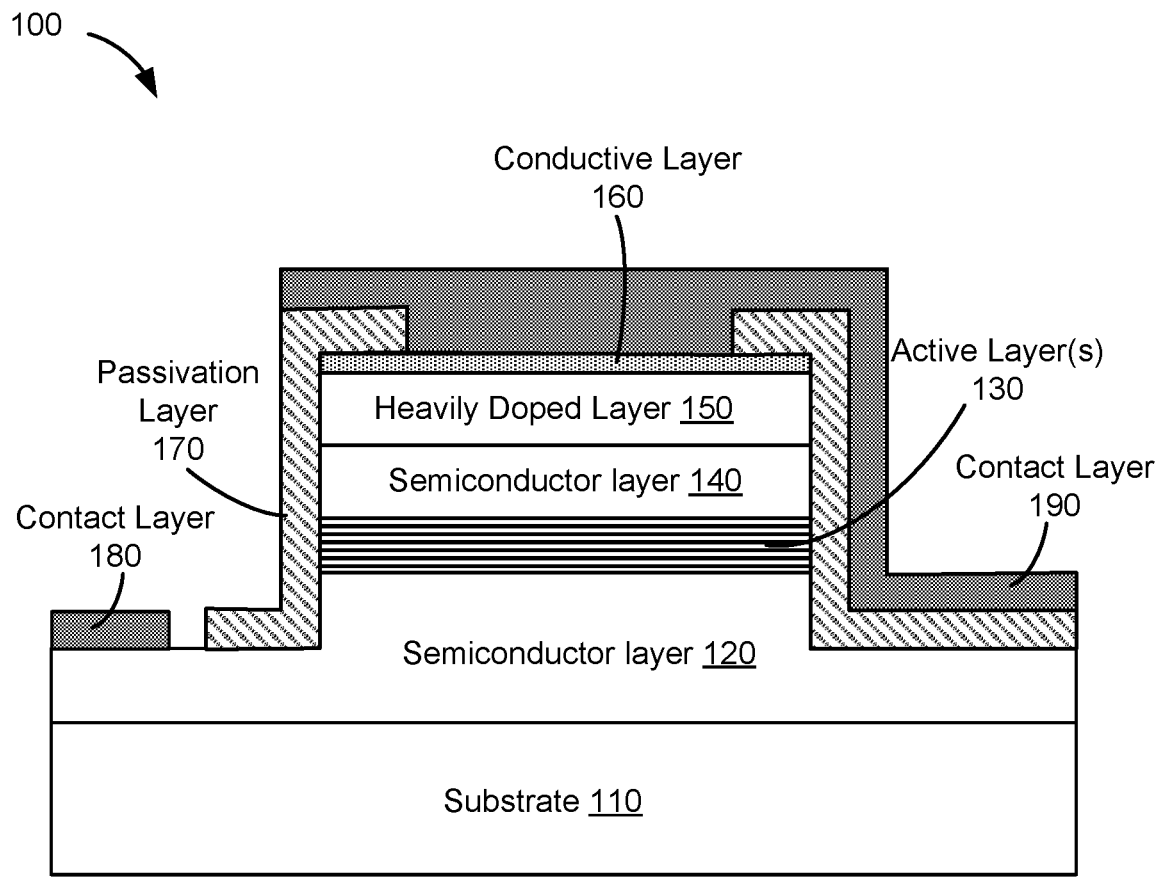
FIG. 1 illustrates an example of a light emitting diode (LED).

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to LEDs having a minimized light emission area. In certain applications, such as LED based flashlights, it is desirable for the light produced by an LED to be widely spread. In other types of applications, such as displays for wearable electronic devices, it can be desirable to minimize the spread of light from an LED. In particular, it is sometimes desirable for an LED to operate as a point source of collimated light. To achieve a good point source, the emission area of the LED should be as small as possible. The smallest achievable size for any particular component of a semiconductor device, referred to herein as the minimum feature size, is often limited by the specific manufacturing equipment used. The minimum feature size could, for example, be on the order of three hundred nanometers (nm).

Semiconductor devices are usually created as a layered structure using multiple processing steps including, for example, deposition and etching. When manufacturing an LED having an emission area corresponding to the minimum feature size, additional precision is often required, especially during etching steps. For example, etching can be performed using photolithography in which a patterned mask is applied to cover areas that are not being etched. If the mask is not properly aligned with respect to the emission area, then areas beyond the emission area (e.g., an area comprising a III-nitride) could be inadvertently exposed to etching agents. Further, if the emission area is formed with the minimum feature size, alignment may be difficult given the level of precision needed for perfect alignment. Therefore, the design of the LED and the manufacturing process should take into consideration the possibility of alignment errors.

Techniques are described herein for creating an LED with a minimized light emission area while protecting areas around the emission area from damage during the manufacturing process. The techniques include, among other things, introducing an etch stopping layer formed of a suitable material that is appropriate in relation to the other materials in or around the emission area. In certain embodiments, the emission area corresponds to an area of an electrical contact, and the etch stopping layer is provided by a conductive body formed around the electrical contact. The example techniques can be applied for use with III-nitride based LEDs, but are also applicable to other types of materials. Other modifications to the LED structures or processing steps described herein will be apparent to one of ordinary skill in the art in view of the present disclosure.

The example LED structures described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a cross-sectional view of an example light emitting diode 100 including a vertical mesa structure. The LED 100 can be formed using inorganic materials, such as semiconductor materials. In certain embodiments, the LED 100 may include one or more layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material is nitrogen, the III-V semiconductor material is referred to as a III-nitride material. The layers can be formed by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers may be grown one layer at a time on a substrate having a certain crystal lattice orientation. The substrate could be, for example, a sapphire, quartz, GaN, GaAs, GaP, or silicon substrate cut in a specific direction to expose a specific crystallographic plane as the growth surface.

In the example shown in FIG. 1, LED 100 includes a substrate 110, which may be formed, for example, using sapphire or GaN. A semiconductor layer 120 may be grown on substrate 110. Semiconductor layer 120 may include a III-V material, such as GaN, and may be p-doped (e.g., with Mg, Ca, Zn, or Be) or n-doped (e.g., with Si or Ge). In turn, one or more active layers 130 may be grown on semiconductor layer 120. Active layers 130 may include one or more InGaN layers, one or more AlInGaP layers, or one or more GaN layers, which may form one or more heterostructures, such as one or more quantum wells. A semiconductor layer 140 may be grown on active layers 130. Semiconductor layer 140 may include a III-V material, such as GaN, and may be p-doped (e.g., with Mg, Ca, Zn, or Be) or n-doped (e.g., with Si or Ge). One of semiconductor layer 120 and semiconductor layer 140 may be a p-type layer and the other one may be an n-type layer. That is, the semiconductor layers 120, 140 can be oppositely doped. The active layers 130 are interposed between the semiconductor layer 120 and the semiconductor layer 140. For example, LED 100 may include a layer of InGaN (e.g., active layer 130) situated between a layer of p-type GaN doped with magnesium (e.g., layer 120) and a layer of n-type GaN doped with silicon or oxygen (e.g., layer 140). The substrate 110 may have a certain crystal lattice structure (e.g., cubic body centered, cubic face centered, or hexagonal). Semiconductor layers that are grown on top of the substrate 110, such as the semiconductor layers 120, 140 and the active layer 130, tend to have crystal lattice structures that are similar to or match that of the substrate 110.

In some embodiments, an electron-blocking layer (EBL) (not shown) may be grown to form a layer between active layers 130 and at least one of semiconductor layer 120 or semiconductor layer 140. The EBL may reduce leakage current and improve the efficiency of the LED. In some embodiments, a heavily-doped semiconductor layer 150, such as a $P^+$ or $P^{++}$ semiconductor layer, may be formed on semiconductor layer 140 and act as a contact layer for forming an ohmic contact and reducing the contact impedance of the device. A conductive layer 160 may be formed on heavily-doped semiconductor layer 150. In embodiments where heavily-doped semiconductor layer 150 is omitted, the conductive layer 160 can be formed directly on semiconductor layer 140. Conductive layer 160 may include, for example, an indium tin oxide (ITO) or Al/Ni/Au film. In one example, conductive layer 160 may include a transparent ITO layer.

To make electrical contact with semiconductor layer 120 and to more efficiently extract light emitted by active layers 130, the semiconductor material layers may be etched to expose semiconductor layer 120 and to form a mesa structure that includes the layers 120-160. The mesa structure may confine carriers within the injection area of the device. Depending on how the mesa structure is etched, the resulting mesa may or may not have surfaces that are orthogonal to the growth planes. For example, if the mesa is formed as a rectangular mesa with vertical sidewalls, the sidewalls can be non-polar (e.g., the (1010) m-plane of a III-nitride semiconductor material with a hexagonal crystal lattice structure) while the horizontal areas of semiconductor layer 120 around the bottom of the sidewalls are polar (e.g., the (0001) c-plane). Alternatively, if the mesa is trapezoidal, the straight sidewalls can be semi-polar (e.g., the (2021) plane). Similarly, if the mesa is domed or parabolic, the curved sidewalls can be semi-polar to different degrees. Thus, conductive layer 160 may contact one or more types of planes (e.g., c-plane, non-polar, and/or semi-polar) depending on the shape of the mesa. Different planes can have different performance characteristics (e.g., higher or lower contact resistance).

A passivation layer 170 may be formed on the sidewalls of the mesa structure. Passivation layer 170 may include an oxide layer, such as an $SiO_2$ layer, and may act as a light reflector that prevents a certain amount of emitted light from escaping out the sides of the mesa. A contact layer 180 can be formed of a metal such as Al, Au, Ni, Ti, or any combination thereof, and may be formed on semiconductor layer 120 to act as an electrode of LED 100. In some embodiments, the contact layer 180 can be formed of a conductive oxide. In addition, another contact layer 190, such as an Al/Ni/Au metal layer or conductive oxide, may be formed on conductive layer 160 to act as another electrode of LED 100.

When a voltage signal is applied across contact layers 180 and 190, electrons and holes may recombine in active layers 130, where the recombination of electrons and holes may cause photon emission. The wavelength and energy of the emitted photons depends on the energy bandgap between the valence band and the conduction band in active layers 130, which varies based on what materials are used for the active layers 130. For example, InGaN active layers may emit green or blue light, while AlInGaP active layers may emit red, orange, yellow, or green light. The emitted photons can be reflected by passivation layer 170 and may exit LED 100 from the top (e.g., the conductive layer 160) or bottom (e.g., the substrate 110).

Figure 2:
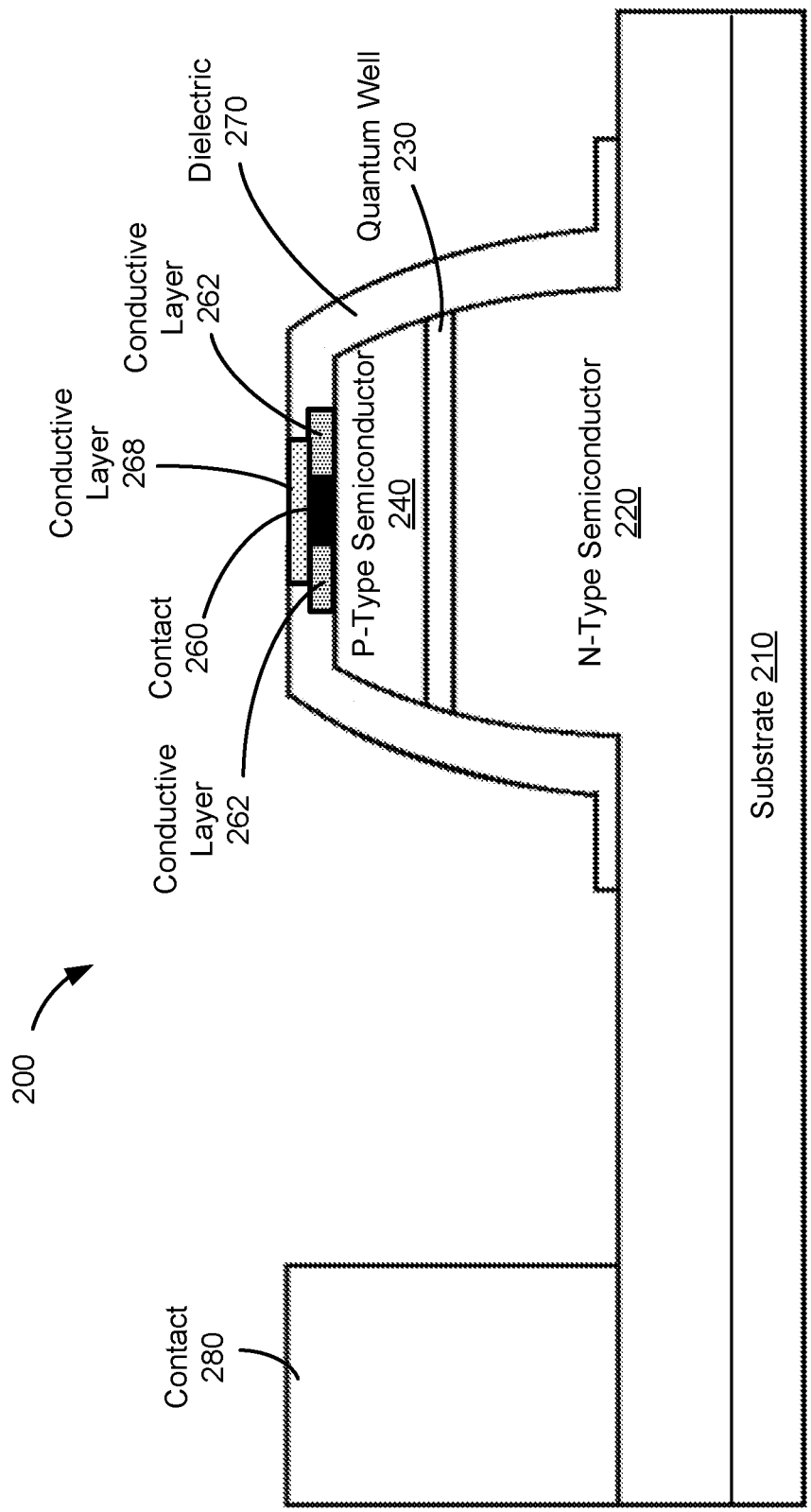
FIG. 2 illustrates an example LED according to certain embodiments.

In some embodiments, LED 100 may include additional, fewer, or different components. For example, LED 100 could include a lens on a light emission surface, such as substrate 110, to focus or collimate the emitted light or to couple the emitted light into a waveguide. Although FIG. 1 depicts the mesa as rectangular, in some embodiments, an LED may include a mesa of another shape, such as a planar, conical, semi-parabolic, or parabolic shape, where a base area of the mesa may be circular, rectangular, hexagonal, or triangular. For example, as shown in FIG. 2, a mesa can have curved sidewalls (e.g., a parabolic shape) and a flat top. The mesa may be truncated or non-truncated. In the example of FIG. 2, the mesa is a dome that has been truncated by removing the top of the dome.

FIG. 2 is a cross-sectional view of a light emitting diode 200 including a semi-parabolic mesa structure. The LED 200 is an example of a specific implementation of the LED 100 in FIG. 1. The LED 200 may include multiple layers of semiconductor materials epitaxially grown on a substrate 210, for example, a sapphire substrate. In particular, the LED 200 is depicted with an n-type semiconductor layer 220 which can, for example, include a III-nitride such as GaN. The n-type semiconductor layer 220 corresponds to semiconductor layer 120 in FIG. 1. The LED 200 further includes a quantum well 230 corresponding to active layers 130. The quantum well 230 can, for example, include one or more InGaN layers or one or more GaN layers. A p-type semiconductor layer 240 is grown on top of the quantum well 230. The p-type semiconductor layer 240 may include a III-nitride, such as GaN, and is p-doped (e.g., with Mg, Ca, Zn, or Be). The p-type semiconductor layer 240 corresponds to semiconductor layer 140 in FIG. 1.

As shown in FIG. 2, LED 200 may include a mesa shaped as a dome with a flat top. The mesa includes a substantially transparent dielectric 270, such as an oxide or a silicon compound (e.g., silicon oxide (SiOx) or silicon nitride (SiNx)). The dielectric 270 corresponds to the passivation layer 170 of FIG. 1. Dielectric 270 can include a material having a refractive index similar to that of semiconductor layer 240. In some embodiments, a reflector (not shown) may be formed on top of dielectric 270 to reflect light emitted from the quantum well 230, e.g., toward the substrate 210. The reflector can be formed, for example, as a layer of aluminum (Al) or silver (Ag). As discussed below, conductive layer 268 can serve in this capacity as a reflector.

The LED 200 further includes electrical contacts 260 and 280, which correspond to conductive layer 160 and contact layer 180, respectively. The contacts 260 and 280 may each include a conductive material, such as Al, Au, Ni, Ti, or any combination thereof, and may act as the electrodes of LED 200. When a voltage signal is applied across electrical contacts 260 and 280, electrons and holes in the quantum well 230 may recombine, where the recombination of electrons and holes is accompanied by photon emission. The emitted photons may propagate in many different directions, and may be reflected, for example, by the reflector formed on top of dielectric 270 towards substrate 210 and exit LED 200. One or more other optical components, such as a lens, may be formed on the light emission surface, such as substrate 210, to focus or collimate the emitted light or couple the emitted light into a waveguide.

Contact 260 forms an ohmic contact to p-type semiconductor layer 240. In particular, the interface between contact 260 and p-type semiconductor layer 240 can be a low resistance electrical junction that has a generally linear current-voltage characteristic. An ohmic contact does not need to have a perfectly linear current-voltage characteristic. Similarly, a non-ohmic contact has a generally non-linear current-voltage characteristic, but does not have to be perfectly non-linear. Contact 260 can be formed with the minimum feature size, i.e., as small as possible, so that less charge is spread across the quantum well 230 when the voltage signal is applied across the contacts 260 and 280. This enables the LED 200 to act as a point source of light that can then be collimated, for example using a lens (not shown). In the example LED structure illustrated in FIG. 2, there are current paths from the contact 260 to the edges of the quantum well 230. However, the least resistive path could be through the contact 260 to the quantum well 230. Therefore, a majority of the current flows through the center of the mesa, from contact 260, through quantum well 230, and into the n-type semiconductor layer 220.

The LED 200 includes a first conductive layer 262 and a second conductive layer 268, which form conductive bodies on or around the contact 260. The conductive layers 262 and 268 can be formed of the same or different materials as the contact 260. For example, in some embodiments, conductive layer 262, conductive layer 268, and contact 260 are each formed of a different metal. The voltage signal that is applied across the contacts 260 and 280 may include a voltage applied to conductive layer 268, which voltage is then transmitted through conductive layer 268 to contact 260. The conductive layer 268 can therefore provide electrical access to the contact 260, in a manner analogous to that of the contact layer 190 in FIG. 1. Additionally, in some embodiments, conductive layer 268 may extend over a greater portion of the mesa than depicted in FIG. 2 and act as a reflector.

Conductive layer 262 can be formed on the same surface of p-type semiconductor 240 as the contact 260, and can be ohmic to the contact 260 while also being a non-ohmic contact to the p-type semiconductor layer 240. In particular, the interface between conductive layer 262 and p-type semiconductor layer 240 can operate as a Schottky barrier that confines current flow to the area around the contact 260. For example, if p-type semiconductor layer 240 is formed of GaN, then conductive layer 262 can be formed of aluminum, since aluminum is non-ohmic with respect to GaN. This would prevent current from flowing into p-type semiconductor layer 240 through the conductive layer 262, and would therefore facilitate the concentration of charge around the area of contact 260. Similar to conductive layer 268, the conductive layer 262 can also act as a reflector.

Additionally, conductive layer 262 can act as an etch stopping layer that protects the p-type semiconductor layer 240 during, for example, etching of the dielectric 270. As shown in FIG. 2, the conductive layer 262 extends around the sides of the contact 260 to cover a portion of the p-type semiconductor layer 240. This enables the conductive layer 262 to accommodate alignment errors that would result in etching of the p-type semiconductor layer 240 in the absence of the conductive layer 262. Thus, the conductive layer 262 enables the contact 260 to be made smaller than would otherwise be possible. Without conductive layer 262, the contact 260 would usually have to be significantly larger than the minimum feature size, e.g., larger than the area of the dielectric etch, so that the contact 260 acts as the etch stopping layer. In the absence of conductive layer 262, the contact 260 could possibly even cover the entire surface of the p-type semiconductor 240 in a manner similar to the depiction of conductive layer 160 in FIG. 1. As illustrated in FIG. 2, in certain embodiments, the conductive layer 268 can be larger in surface area than the contact 260, but may not extend past the conductive layer 262. Alternatively, conductive layer 268 could be larger than conductive layer 262, for example, so that conductive layer 268 extends over the sides of the mesa to provide a larger reflective area.

In semiconductor LEDs, light is usually generated at an internal quantum efficiency (IQE) through the recombination of electrons and holes within an active region (e.g., one or more active layers), where the internal quantum efficiency is the proportion of the radiative electron-hole recombination in the active region that emits photons. IQE is a function of charge-carrier density in the active region. The generated light is then extracted from the LEDs in a particular direction or solid angle. The ratio between the number of emitted photons extracted from an LED and the number of electrons passing through the LED is referred to as the external quantum efficiency (EQE), which describes how efficiently the LED coverts injected electrons to photons that are extracted from the device. The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device.

Various approaches may be used to improve the overall efficiency of an LED, such as increasing injection efficiency by optimizing the doping level of one or more semiconductor layers or by using a mesa structure to confine the carriers in the active region. As another example, extraction efficiency can be increased by using a reflective layer, on the sidewalls or the dome of the mesa structure, to direct the light out of the LED. In the example of FIG. 2, the internal quantum efficiency can be improved by forming the contact 260 with the minimum feature size, as this tends to increase current density, and therefore charge-carrier density, in the active region (e.g., quantum well 230).

FIGS. 3-11 illustrate various stages in a process for fabricating an LED, according to certain embodiments. The stages illustrated in FIGS. 3-11 are presented in sequence. However, alternative sequences and process steps are possible.

Figure 3:
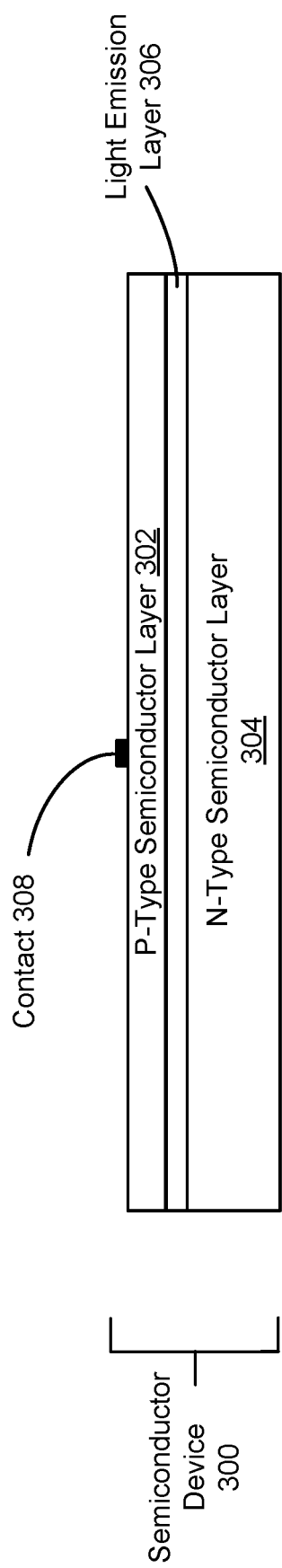
FIGS. 3-10, 11A and 11B illustrate various stages in a process for fabricating an LED, according to certain embodiments.

FIG. 3 shows a cross-sectional view of a layered semiconductor device 300 being fabricated into an LED. In particular, the semiconductor device 300 can, as illustrated in FIGS. 3-11, be fabricated into a structure corresponding to the LED 200 in FIG. 2. The semiconductor device 300 includes a first semiconductor layer 302 and a second semiconductor layer 304 which, in this example, are p-type and n-type, respectively. A light emission layer 306 is interposed between the p-type semiconductor layer 302 and the n-type semiconductor layer 304. Thus, the p-type semiconductor layer 302 corresponds to p-type semiconductor layer 240, n-type semiconductor layer 304 corresponds to n-type semiconductor layer 220, and light emission layer 306 corresponds to quantum well 230. The n-type semiconductor layer 304 can be formed on a surface of a substrate (not shown) which can be, for example, a sapphire substrate. The semiconductor layers 302 and 304 and the light emission layer 306 can be epitaxially grown with appropriate dopants introduced. A contact 308 is formed on top of p-type semiconductor layer 302 and corresponds to contact 260 in FIG. 2.

Figure 4:
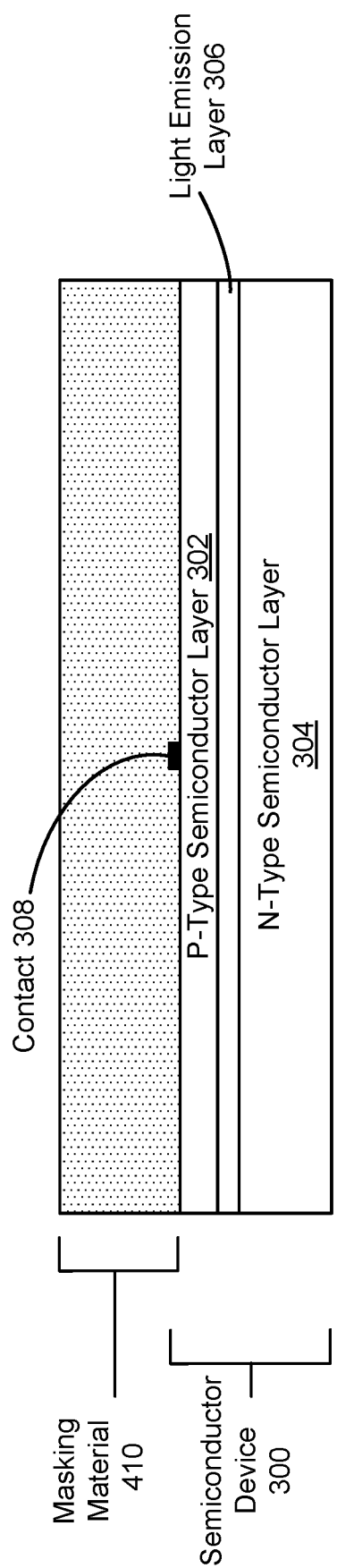

FIG. 4 shows a layer of masking material 410 formed to cover the p-type semiconductor layer 302. The mask layer can be formed, for example, by depositing SiOx onto the top surface of p-type semiconductor layer 302 using evaporation or sputtering. The masking material 410 will eventually be converted into a mesa shaped mask 610, shown in FIG. 6.

Figure 5:
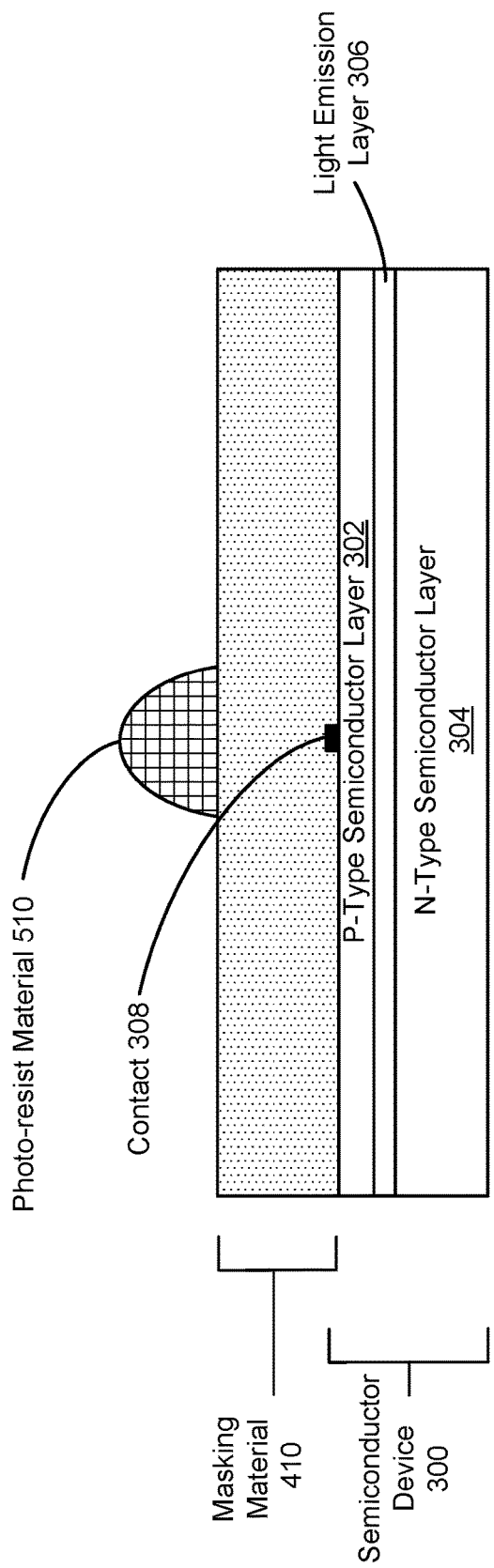

FIG. 5 shows a photo-resist material 510 formed on top of the masking material 410. The photo-resist material 510 acts as a sacrificial material that enables the masking material 410 to be etched into the desired shape of the mesa. In the example of FIG. 5, the photo-resist material 510 is dome shaped. Various techniques exist for shaping photo-resist materials including, for example, pressure molding or thermal reflowing. After the photo-resist material 510 has reached the desired shape, the photo-resist material 510 can be cured, for example, using ultraviolet light. The photo-resist material 510 is positioned over the contact 308, for example, such that the contact 308 is centered within the mesa being formed.

Figure 6:
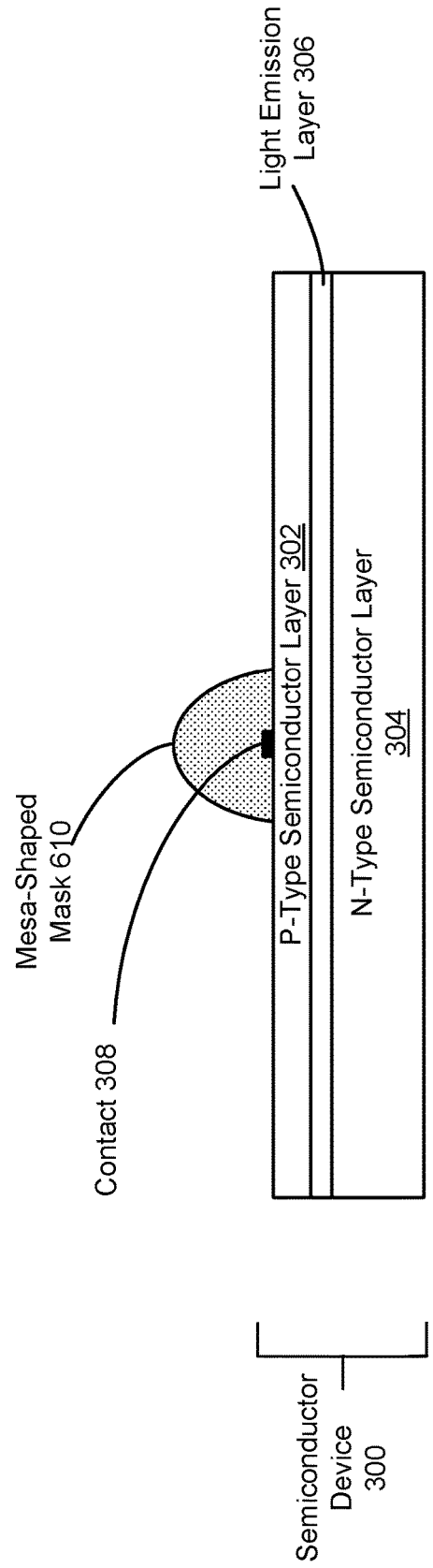

FIG. 6 shows the masking material 410 converted into a mesa-shaped mask 610 by etching the masking material 410 so that the masking material 410 takes on the shape of the photo-resist material 510. For example, masking material 410 may be subjected to an anisotropic dry etch using hydrogen fluoride. During the etching of the masking material 410, the photo-resist material 510 is eroded, leaving only the mesa-shaped mask 610 on top of the p-type semiconductor layer 302, as shown in FIG. 6. In turn, the mesa-shaped mask 610 can be used to etch a similar or identical shape into the semiconductor device 300.

Figure 7:
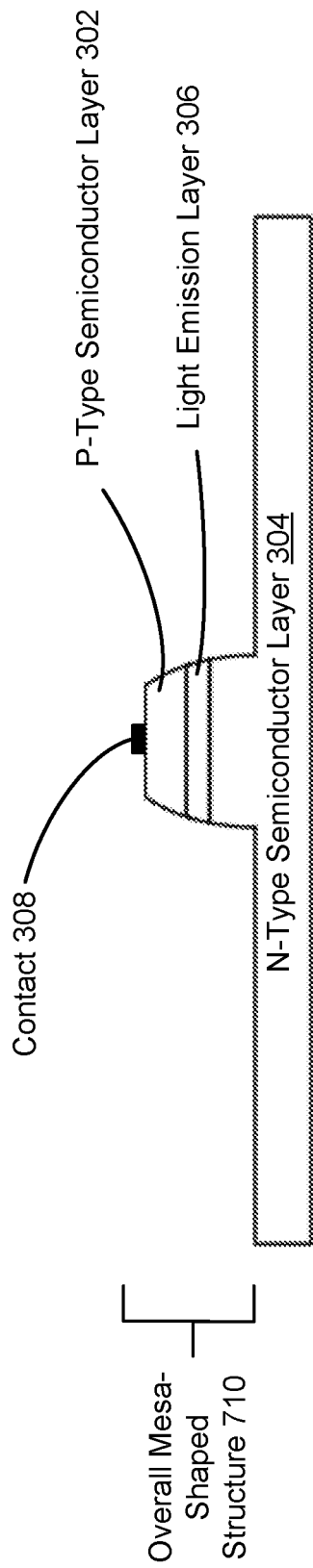

FIG. 7 shows the result of etching the semiconductor device 300 using the mesa-shaped mask 610. Similar to the photo-resist material 510, the mesa-shaped mask 610 can act as a sacrificial material that imparts the desired mesa shape onto the semiconductor device 300. The mesa-shaped mask 610 and the semiconductor device 300 can be etched simultaneously to form an overall mesa-shaped structure 710 comprising contact 308, p-type semiconductor layer 302, light emission layer 306, and a top portion of the n-type semiconductor layer 304. The etching may completely remove the mesa-shaped mask 610 to expose the contact 308.

Figure 8:
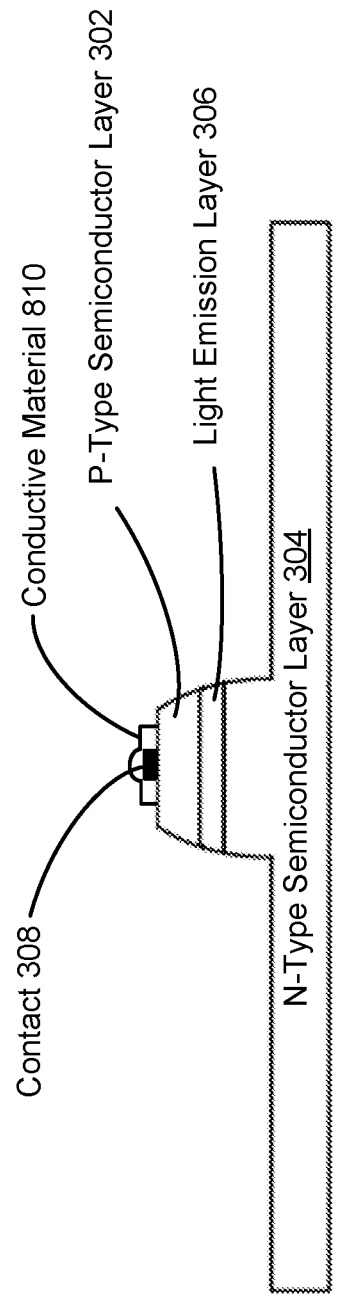

FIG. 8 shows a body of conductive material 810 formed over the contact 308 by, for example, depositing a layer of metal. The conductive material 810 corresponds to conductive layer 262 in FIG. 2. As shown in FIG. 8, the conductive material 810 extends past the sides of the contact 308. This enables the conductive material 810 to act as an effective etch stop layer during a subsequent dielectric etching step (discussed below). In some embodiments, the conductive material 810 may be formed over the contact 308 before etching the semiconductor device 300 into the mesa shape.

Figure 9:
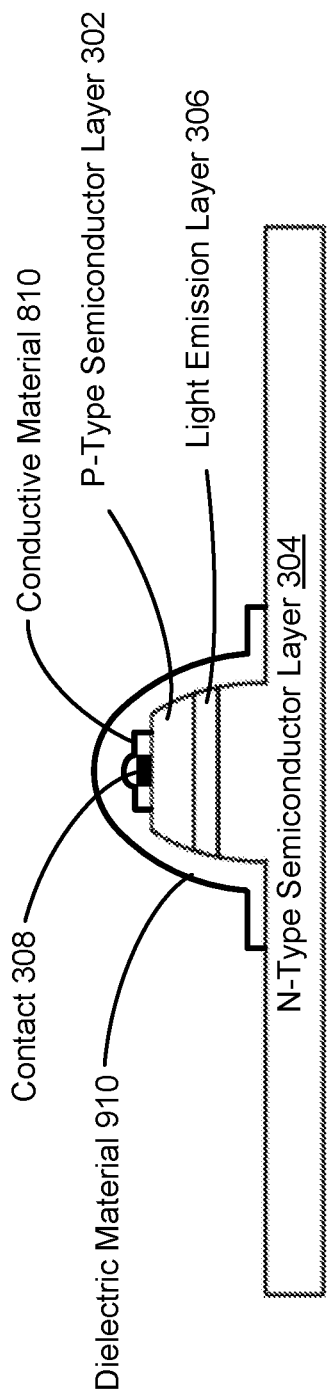

FIG. 9 shows a layer of dielectric material 910 deposited over the mesa. The dielectric material 910 acts as a passivation layer and corresponds to the dielectric 270 in FIG. 2. When deposited, the dielectric material 910 covers the entire mesa. Therefore, the dielectric material 910 is etched in order to access the contact 308. The etching agent for the dielectric etch can be a plasma. For example, the dielectric material 910 could be etched using Radio Frequency (RF) oxygen plasma etching or inductively coupled plasma (ICP) etching. Unlike the etching agents used when etching the semiconductor device 300 to form the mesa, the plasma used for etching the dielectric material 910 can, depending on what materials are used for the p-type semiconductor layer 302, potentially damage the p-type semiconductor layer 302. As explained earlier in connection with FIG. 2, the presence of the conductive layer 262 (corresponding to conductive material 810) prevents unintended etching of the semiconductor material (e.g., the p-type semiconductor layer 302) around the contact region of the mesa.

Figure 10:
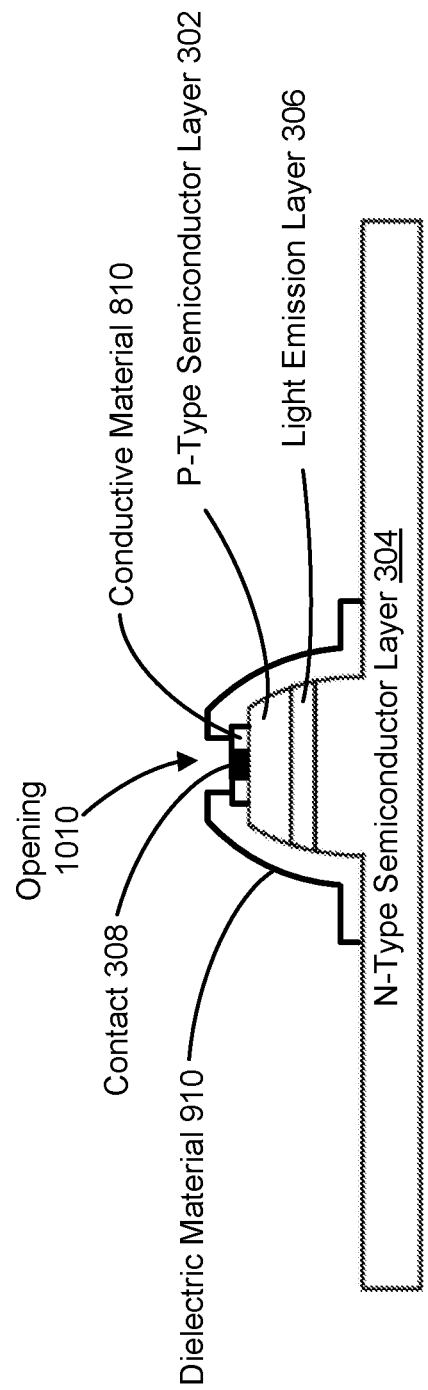

FIG. 10 shows the result of etching the dielectric material 910 to form an opening 1010 that provides access to the contact 308. The etching may involve applying a masking material, which could be a photo-resist, that is patterned to expose an area corresponding to the opening 1010. The dielectric etch can be performed over an area that is smaller than the area covered by the conductive material 810, thereby ensuring that the p-type semiconductor layer 302 does not get etched as part of etching the dielectric material 910. Further, since the conductive material 810 covers an additional area around the perimeter of the contact 308, the alignment of the mask for the dielectric etch with respect to the contact 308 does not have to be as precise as it would be if the conductive material 810 were absent. The opening 1010 can then be filled with a second conductive material 1110 (shown in FIG. 11A) to enable an electrical signal to be applied to the contact 308 through the second conductive material.

Figure 11A:
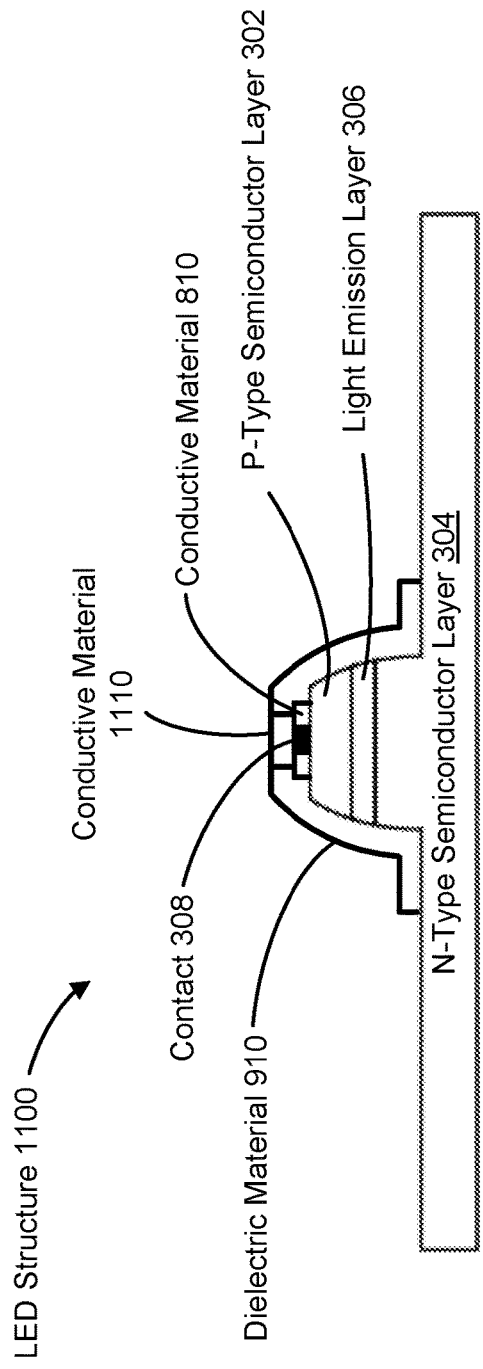

FIG. 11A shows a cross-sectional view of an LED structure 1100, which includes the conductive material 1110 filling the opening 1010 in FIG. 10. The LED structure 1100 corresponds to the LED 200 in FIG. 2 minus certain elements which have been omitted for clarity, such as the substrate 210 and the contact 280. As mentioned earlier in connection with FIG. 2, the conductive layer 268 can be formed to cover the sides of the mesa in order to facilitate the reflection of emitted light. Similarly, the conductive material 1110 can extend at least partially over the sides of the mesa (e.g., covering a portion of the dielectric material 910) to reflect light from the light emission layer 306. The conductive material 1110 can form an interconnect to a driver circuit (not shown) that supplies an electrical signal to drive the LED. The LED structure 1100 can be replicated to form multiple LED structures 1100 on the n-type semiconductor layer 304. For instance, multiple LED structures 1100 of substantially the same height can be bump bonded to corresponding interconnects on a driver circuit that applies voltage signals for individually driving each LED. The driver circuit can be attached, for example, by stacking the driver circuit on top of the LED structures 1100 with solder bumps placed between the contacts of the driver circuit and the conductive material 1110 of each LED structure, and then reflowing the solder bumps.

Figure 11B:
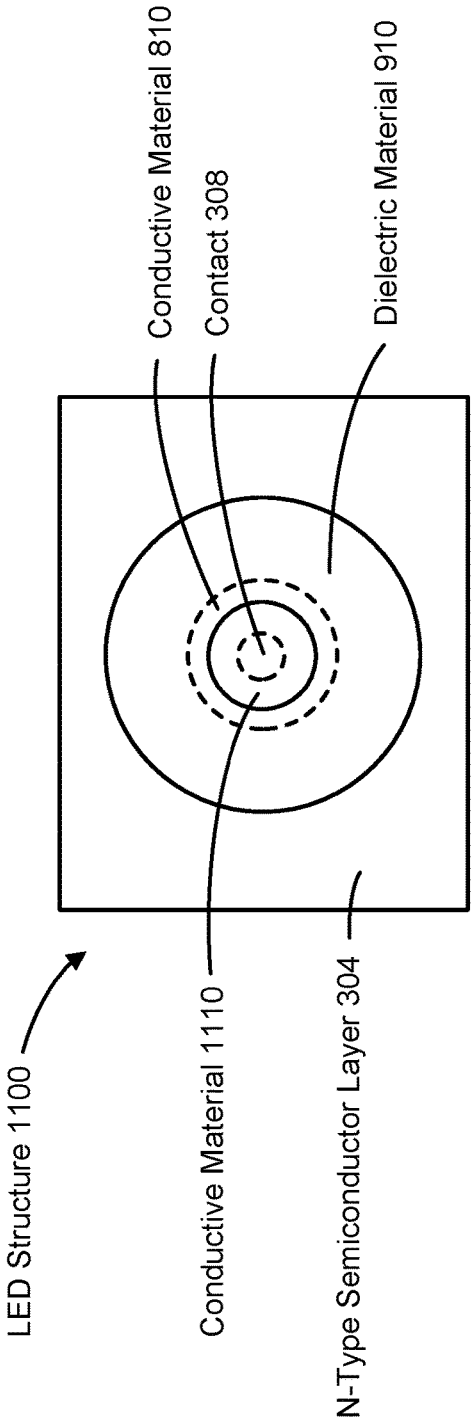

FIG. 11B shows a top view of the LED structure 1100. The contact 308 and the conductive material 810 are depicted with broken lines to indicate that these layers are hidden underneath the dielectric material 910 and the conductive material 1110. The p-type semiconductor layer 302 and the light emission layer 306 are omitted for clarity. As shown in FIG. 11B, the conductive material 1110 covers a surface area larger than that covered by contact 308, with the conductive material 810 being formed around the perimeter of the contact 308. Thus, the conductive material 810 extends the footprint of the contact 308 by creating an additional conductive surface area in contact with the p-type semiconductor layer 302. FIG. 11B also depicts the conductive material 810 as extending past the conductive material 1110.

Figure 12:
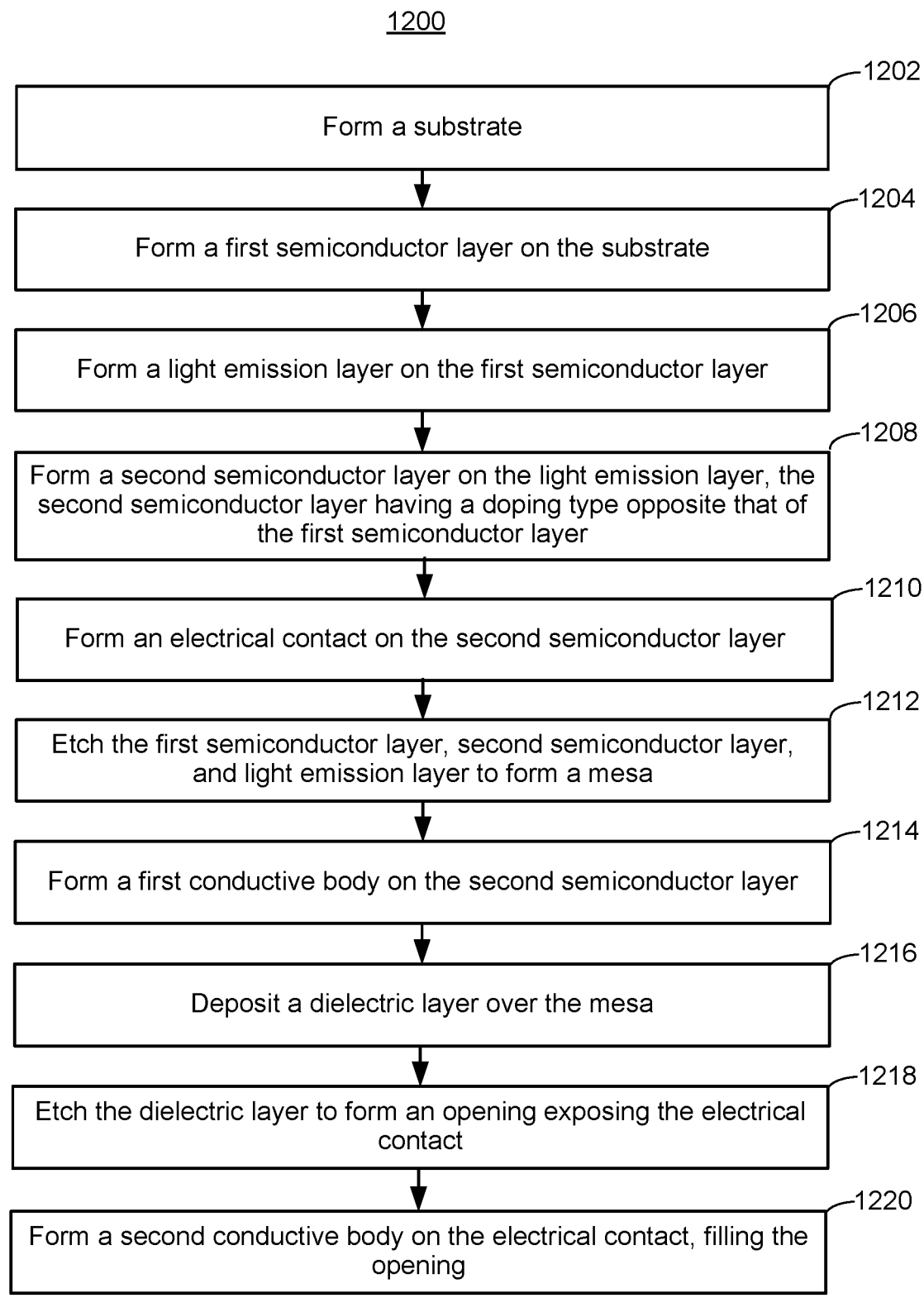
FIG. 12 is a flow chart of an example method for fabricating an LED device, according to certain embodiments.

FIG. 12 is a flow chart illustrating an example method 1200 of fabricating an LED device, according to certain embodiments. The method 1200 can, in certain embodiments, be performed in software, for example, as computer-readable instructions stored on a non-transitory computer-readable medium, where the instructions are executable by one or more processors of a computer system controlling semiconductor manufacturing equipment. The operations described in FIG. 12 may be performed by one or more semiconductor fabrication systems that include, for example, molecular beam epitaxy (MBE) or metalorganic chemical vapor deposition (MOCVD) equipment. The operations described in FIG. 12 are for illustration purposes only and are not intended to be limiting. In various implementations, modifications may be made to method 1200 to add additional operations or to omit some operations.

At step 1202, a substrate, such as a sapphire substrate or a bulk III-V semiconductor substrate (e.g., a GaN substrate) is formed. The substrate may be cut along a certain crystal growth plane, for example, a semi-polar plane or a c-plane, to expose a corresponding facet.

At step 1204, a first semiconductor layer may be formed (e.g., epitaxially grown) on the substrate. The first semiconductor layer can be formed directly on a surface (e.g., the exposed facet) of the substrate, in which case the first semiconductor layer may have the same or a similar crystal lattice structure as the surface of the substrate. Alternatively, in some embodiments, a buffer layer may be introduced between the substrate and the first semiconductor layer to accommodate differences between the crystal structures of the first semiconductor layer and the substrate. The first semiconductor layer can be an III-V material (e.g., a III-nitride) and may be doped with a certain dopant type (e.g., n-type).

At step 1204, an light emission layer is formed on the first semiconductor layer. The light emission layer can include one or more active layers, at least one of which is a quantum well. Depending on the color of light to be emitted by the LED being formed, various materials can be incorporated into the light emission layer. For example, to generate green or blue light, a compound comprising nitrogen in combination with one or more of indium, gallium, or aluminum can be used (e.g., InGaN or GaN). In some embodiments, the light emission layer can include multiple quantum wells.

As step 1208, a second semiconductor layer is formed on the light emission layer. The second semiconductor layer can be a III-V material with a doping type opposite that of the first semiconductor layer. For example, the first semiconductor layer and the second semiconductor layer can both be formed of the same III-nitride material (e.g., GaN), but with one of the semiconductor layers being n-type and the other semiconductor layer being p-type.

At step 1210, an electrical contact is formed on the second semiconductor layer. The electrical contact can be formed of any suitable conductive material including, for example, a conductive oxide or a metal, where the oxide/metal forms an ohmic contact to the second semiconductor layer. Addition-ally, the electrical contact can be formed with the minimum feature size that the manufacturing equipment is capable of producing.

At step 1212, the first semiconductor layer, the second semiconductor layer, and the light emission layer are etched to form a mesa, e.g., a vertical or dome shaped mesa. The mesa structure may include sidewalls that are curved or straight depending on the mesa shape. The etching can be such that the base of the resulting mesa structure extends from the first semiconductor layer (e.g., the n-type semiconductor 220 in FIG. 2).

At step 1214, a first conductive body is formed on the second semiconductor layer. The first conductive body can be formed around the electrical contact such that the electrical contact is surrounded, at least laterally, by the first conductive body. In some embodiments, the first conductive body may be deposited on top of the electrical contact (e.g., in the same manner as conductive material 810 in FIG. 8) and subsequently etched to expose the electrical contact. The first conductive body can be formed of any suitable conductive material and, in some embodiments, a material that forms a non-ohmic contact to the second semiconductor layer.

At step 1216, a dielectric layer is deposited over the mesa. The dielectric layer acts as a passivation layer and may comprise, for example, $SiO_2$, $SiN_x$, or $Al_2O_3$.

At step 1218, the dielectric layer is etched to form an opening exposing the electrical contact. The width of the opening can be greater than that of the electrical contact.

At step 1220, a second conductive body is formed on the electrical contact. For example, the second conductive body can be formed by depositing conductive material to completely fill the opening in the dielectric layer and be in direct contact with a surface of the electrical contact. The second conductive body can, but does not have to be, formed of a different material than the first conductive body (e.g., Al, Ni, Au, or a combination thereof). In some embodiments, the second conductive body is a reflective material that covers at least a portion of the sidewalls of the mesa in order to reflect the light emitted by the light emission layer.

Although only one mesa structure (corresponding to a single LED) is described with respect to FIG. 12, multiple mesa structures, such as a one-dimensional or two-dimensional array of mesa structures, may be formed simultaneously. For example, the etching in step 1212 can form an array of mesa structures on the same die or wafer. Similarly, the deposition of the dielectric layer in 1216 may involve coating an array of mesa structures with a dielectric material. Therefore, the method 1200 can be applied to simultaneously fabricate multiple LEDs.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The methods and apparatuses discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. An apparatus for emitting light, comprising:
a first semiconductor layer, the first semiconductor layer having a doping type;
a second semiconductor layer, the second semiconductor layer having a doping type opposite that of the first semiconductor layer;
a light emission layer between the first semiconductor layer and the second semiconductor layer;
an electrical contact formed on the second semiconductor layer, wherein the electrical contact is an ohmic contact to the second semiconductor layer and is configured to receive an electrical signal that causes the light emission layer to generate light; and
a first conductive body formed around the electrical contact, wherein the first conductive body is a non-ohmic contact to the second semiconductor layer, and wherein the first semiconductor layer, the second semiconductor layer, and the light emission layer form a mesa.

2. The apparatus of claim 1, wherein the second semiconductor layer comprises a III-nitride material.

3. The apparatus of claim 1, wherein the electrical contact is formed of a metal.

4. The apparatus of claim 1, further comprising:
a dielectric layer extending over sidewalls of the mesa.

5. The apparatus of claim 4, further comprising:
a second conductive body that fills an opening within the dielectric layer and is formed on a surface of the electrical contact, wherein the second conductive body has a larger surface area than the electrical contact.

6. The apparatus of claim 5, wherein the first conductive body extends past the second conductive body.

7. The apparatus of claim 5, wherein the second conductive body extends past the first conductive body, at least partially extends over the sidewalls of the mesa, and is formed of a light reflective material.

8. The apparatus of claim 5, wherein the opening within the dielectric layer is larger in width than the electrical contact.

9. The apparatus of claim 5, wherein the electrical signal is passed to the electrical contact through the second conductive body.

10. A method for manufacturing a light emitting apparatus, the method comprising:
forming a first semiconductor layer on a substrate, the first semiconductor layer having a doping type;
forming a light emission layer on the first semiconductor layer;
forming a second semiconductor layer on the light emission layer such that the light emission layer is situated between the first semiconductor layer and the second semiconductor layer, the second semiconductor layer having a doping type opposite that of the first semiconductor layer;
forming an electrical contact on the second semiconductor layer, wherein the electrical contact is an ohmic contact to the second semiconductor layer;
etching the first semiconductor layer, the second semiconductor layer, and the light emission layer to form a mesa; and
forming a first conductive body around the electrical contact, wherein the first conductive body is a non-ohmic contact to the second semiconductor layer.

11. The method of claim 10, wherein the second semiconductor layer comprises a III-nitride material.

12. The method of claim 10, wherein the electrical contact is formed of a metal.

13. The method of claim 10, further comprising:
depositing a dielectric layer over the mesa, the dielectric layer extending over sidewalls of the mesa, wherein the dielectric layer is deposited after the forming of the first conductive body.

14. The method of claim 13, further comprising:
etching the dielectric layer to form an opening that exposes the electrical contact, wherein the first conductive body operates to prevent damage to the second semiconductor layer during the etching of the dielectric layer.

15. The method of claim 14, wherein the opening is larger in width than the electrical contact.

16. The method of claim 14, further comprising:
filling the opening with a second conductive body, wherein the second conductive body is formed on a surface of the electrical contact, and wherein the second conductive body has a larger surface area than the electrical contact.

17. The method of claim 16, wherein the first conductive body extends past the second conductive body.

18. The method of claim 16, wherein the second conductive body extends past the first conductive body, at least partially extends over the sidewalls of the mesa, and is formed of a light reflective material.

19. An apparatus fabricated by a method, the method comprising:
forming a first semiconductor layer on a substrate, the first semiconductor layer having a doping type;
forming a light emission layer on the first semiconductor layer;
forming a second semiconductor layer on the light emission layer such that the light emission layer is situated between the first semiconductor layer and the second semiconductor layer, the second semiconductor layer having a doping type opposite that of the first semiconductor layer;
forming an electrical contact on the second semiconductor layer, wherein the electrical contact is an ohmic contact to the second semiconductor layer;
etching the first semiconductor layer, the second semiconductor layer, and the light emission layer to form a mesa; and
forming a first conductive body around the electrical contact, wherein the first conductive body is a non-ohmic contact to the second semiconductor layer.

20. The apparatus of claim 19, wherein the method of fabricating the apparatus further comprises:

depositing a dielectric layer over the mesa, the dielectric layer extending over sidewalls of the mesa, wherein the dielectric layer is deposited after the forming of the first conductive body; and etching the dielectric layer to form an opening that exposes the electrical contact, wherein the first conductive body operates to prevent damage to the second semiconductor layer during the etching of the dielectric layer.

\* \* \* \* \*